United States Patent
Yamaha et al.

[11] Patent Number: 6,150,720
[45] Date of Patent: Nov. 21, 2000

[54] SEMICONDUCTOR DEVICE HAVING MANUFACTURING WIRING STRUCTURE WITH BURIED PLUGS

[75] Inventors: Takahisa Yamaha; Tetsuya Kuwajima, both of Hamamatsu, Japan

[73] Assignee: Yamaha Corporation, Japan

[21] Appl. No.: 09/223,534

[22] Filed: Dec. 30, 1998

Related U.S. Application Data

[63] Continuation of application No. 09/138,552, Aug. 24, 1998.

[30] Foreign Application Priority Data

Aug. 27, 1997 [JP] Japan .................................. 9-231028

[51] Int. Cl.[7] ................................................ H07L 23/532
[52] U.S. Cl. .......................... 257/751; 257/763; 257/770; 257/915
[58] Field of Search .................................... 257/915, 751, 257/764, 763, 767, 770; 438/643, 653, 927

[56] References Cited

U.S. PATENT DOCUMENTS

| | | | |
|---|---|---|---|
| 4,926,237 | 5/1990 | Sun et al. .................................... | 357/71 |
| 5,240,880 | 8/1993 | Hindman et al. ........................ | 437/190 |
| 5,317,187 | 5/1994 | Hindman et al. ........................ | 257/659 |
| 5,449,954 | 9/1995 | Ito ............................................ | 257/751 |
| 5,514,908 | 5/1996 | Liao et al. ................................ | 257/751 |
| 5,602,053 | 2/1997 | Zheng et al. ................................ | 437/60 |
| 5,668,411 | 9/1997 | Hong et al. ................................ | 257/751 |
| 5,738,917 | 4/1998 | Besser et al. ........................... | 427/576 |
| 5,763,948 | 6/1998 | Sumi ........................................ | 257/763 |

FOREIGN PATENT DOCUMENTS

| | | |
|---|---|---|
| 4-214653 | 8/1992 | Japan . |
| 5-6865 | 1/1993 | Japan . |
| 5-121356 | 5/1993 | Japan . |

*Primary Examiner*—David Hardy
*Attorney, Agent, or Firm*—Ostrolenk, Faber, Gerb & Soffen, LLP

[57] ABSTRACT

In a wiring forming method according to the present invention, an insulating layer is formed on a semiconductor substrate, and contact holes are formed in the insulating layer. A titanium layer is deposited on the insulating layer so as to be along inner surfaces of the contact holes. A first titanium nitride layer is formed on the titanium layer including the titanium layer formed in the contact holes. The deposition of the first titanium nitride layer is carried out under atmosphere which substantially includes no oxygen. A titanium oxynitride layer is deposited on the first titanium nitride layer. A second titanium nitride layer is deposited on the titanium oxynitride layer. Buried plugs are formed on the second titanium nitride layer formed in the contact holes. A wiring connected to the buried plugs are formed on the insulating layer. A barrier metal layer and the buried plugs are thus formed in the contact holes. According to such the structure, a stable electric contact can be obtained.

4 Claims, 4 Drawing Sheets

SEMICONDUCTOR DEVICE HAVING MANUFACTURING WIRING STRUCTURE WITH BURIED PLUGS

This is a continuation of application Ser. No. 09/138,552, filed Aug. 24, 1998. This application is based on Japanese Patent Application No. 9-231028 filed on Aug. 27, 1997, the entire contents of which are incorporated herein by reference.

BACKGROUND OF THE INVENTION a) Field of the Invention

The present invention relates to a semiconductor device and a method of manufacturing a wiring structure, more specifically, to a method of manufacturing a wiring structure having an upper wiring layer and lower conductive regions connected via contact holes formed in an insulating layer, and a semiconductor.

b) Description of the Related Art

It is known that a barrier metal layer formed between a semiconductor substrate and a wiring layer of a semiconductor integrated circuit prevents reactions between the substrate and the wiring layer from occurring and enables a stable electric connection. Laid-open Japanese patent application No. 4-214653 discloses a barrier metal layer comprising a titanium layer and a titanium oxynitride layer. The titanium layer reduces the contact resistance between the semiconductor substrate and the wiring layer. The titanium oxynitride layer prevents reactions between the semiconductor substrate and the wiring layer from occurring.

Laid-open Japanese patent application Nos. 5-6865 and 5-121356 disclose a trilayer barrier metal consisting of a titanium layer, a titanium nitride layer and a titanium oxynitride layer. The titanium oxynitride layer is formed by oxidizing the titanium nitride layer.

In this specification, the ratio of O to N in the titanium oxynitride (TiON) layer is not limited to a 1 to 1 ratio. $TiO_xN_{1-x}$ (x is approximately 0.1) is usual composition of a titanium nitride layer used as a barrier metal. The value of x varies depending on the amount of additive $O_2$ during the sputtering for deposition.

Such a bilayer structure of a barrier metal layer having a titanium oxynitride layer deposited on a titanium layer has been used conventionally. However, an experiment carried out by the inventors of the present invention proved that such structure hardly shows good electric contact.

SUMMARY OF THE INVENTION

It is an object of the present invention to provide a method of manufacturing a wiring structure and a semiconductor device, which can obtain stable electric contact by forming a barrier metal layer and buried plugs in contact holes.

According to one aspect of the present invention, it is provided a method of manufacturing a wiring structure, comprises the steps of: providing a substrate having a semiconductor area on its surface; forming an insulating layer, having a hole therein, on the semiconductor substrate; the hole exposing a partial region of the semiconductor area; forming a titanium layer over the substrate; forming a first titanium nitride layer on the titanium layer without introducing oxygen; forming a titanium oxynitride layer on the first titanium nitride layer; forming a second titanium nitride layer on the titanium oxynitride layer; forming a conductive layer on the second titanium nitride layer; and removing a conductive layer to form a conductive plug in the hole.

This structure can prevent a surface of the titanium layer from being oxidized because the atmosphere during deposition of the first titanium nitride layer on the titanium layer includes no oxygen. Oxidization of the titanium layer surface is caused by the oxide atmosphere during the titanium oxynitride layer deposition. The above described structure prevents such oxidization from occurring because the titanium layer is not exposed to the atmosphere at beginning of the titanium oxynitride layer deposition.

In the above described structure, the titanium oxynitride layer is covered with the second titanium nitride layer during the buried plug formation. This prevents the titanium oxynitride layer from discharging oxygen. As a result, the bad influences caused by oxygen are reduced.

According to the other aspect of the present invention, it is provided a semiconductor device comprising: a substrate on which conductive regions of semiconductor material are formed partially; an insulating layer formed on the substrate, in which contact holes are formed so that their bottom openings are applied to the conductive regions; a titanium layer formed along inner surfaces of the contact holes; a first titanium nitride layer formed on the titanium layer in the contact holes; a titanium oxynitride layer formed on the first titanium nitride layer in the contact holes; a second titanium nitride layer formed on the titanium oxynitride layer in the contact holes; buried plugs of conductive material formed on the second titanium nitride layer in the contact holes; and a wiring formed on the insulating layer, and electrically connected to the buried plugs.

The titanium layer reduces the contact resistance between the conductive region and the wiring. The first titanium nitride layer prevents oxidization of the titanium layer surface during the titanium oxynitride layer deposition from occurring. The titanium oxynitride layer works as a barrier metal layer. The second titanium nitride layer prevents the titanium oxynitride layer from discharging oxygen during the buried plug forming.

As described above, a titanium layer is deposited in contact holes. Then a surface of the titanium layer is covered with a first titanium nitride layer before a titanium oxynitride layer is deposited thereon. The titanium oxinitride layer works as a barrier metal layer. Thus, the titanium layer is not exposed to the oxide atmosphere during the titanium oxynitride layer deposition. Therefore, the surface of the titanium layer is prevented from being oxidized. After the titanium oxynitride layer is deposited, a surface of the titanium oxynitride layer is covered with a second titanium nitride layer before the buried plug is formed. Thus, oxygen is prevented from being discharged from the titanium oxynitride layer during the buried plug formation. Moreover, this prevents oxygen from suffering harmful influences. Those effects bring stable electric contact between the semiconductor substrate surface and the wiring layer.

DETAILED DESCRIPTION OF THE PREFERRED EMBODIMENT

An experiment was carried out for evaluating contact resistance of a wiring structure. In this case, the barrier metal layer consists of titanium oxynitride. The result of the experiment will now be described first.

In the experiment, contact holes each having a diameter of 0.45 micrometers and an aspect ratio of 1.8, connect n-type and p-type diffusion regions on a silicon substrate surface to a wiring layer. The n-type region is formed by implanting $P^+$ ions at a dose amount of $5 \times 10^{15}$ cm$^{-2}$. The p-type region is formed by implanting $BF_2^+$ ions at a dose amount of $2 \times 10^{15}$ cm$^{-2}$. After ion implanting, heat treatment at approximately 950° C. was carried out for activation. A titanium layer having a thickness of 20 nm and a titanium oxynitride layer having a thickness of 100 nm are deposited between the wiring layer and the silicon substrate within the contact holes. After deposition of the titanium layer with the sputtering, the titanium oxynitride layer is deposited by reactive sputtering with a mixed sputtering gas of oxygen and nitrogen.

The contact resistance between the n-type region and the wiring layer is 55 ohm and that between the p-type region and the wiring layer is 157 ohm. The resistance at those contacts show non-ohmic contact characteristics. The non-ohmic contact characteristics show non-proportional relationship between a current and a voltage.

The inventors concluded that the electric contact was not good because the titanium oxide layer was formed at boundary between the titanium layer and titanium oxynitride layer. Later-described embodiment realizes the deposition without forming a titanium oxide layer.

Problems in the case where contact holes are filled with tungsten (W) plugs with a barrier metal layer of titanium oxynitride, will now be described with reference to FIG. 4.

Figure 4:
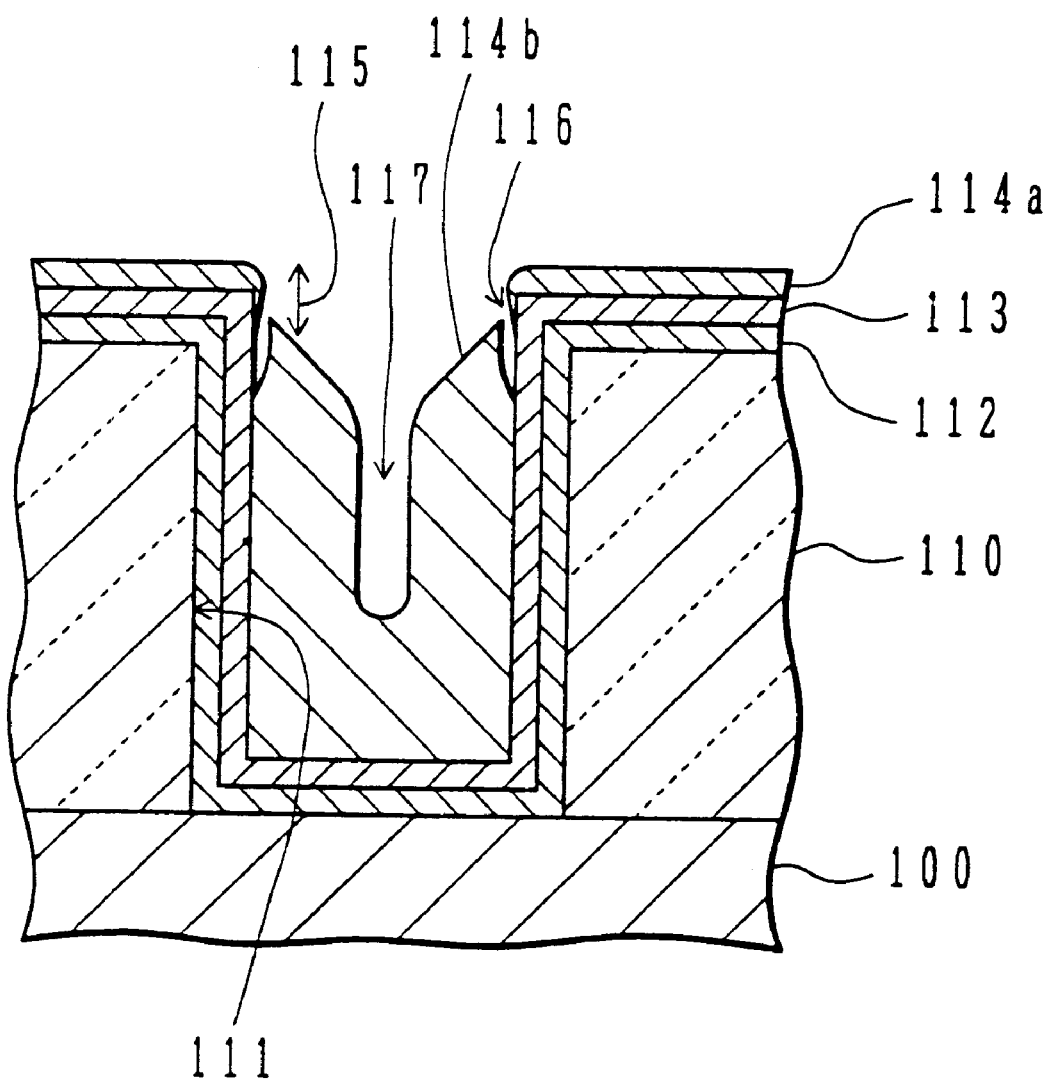
FIG. 4 is a sectional view of a tungsten (W) plug formed by an experiment carried out by the inventors.

FIG. 4 is a sectional view showing a tungsten plug buried in a contact hole. An insulating layer 110 is formed on a silicon substrate 100, and contact holes 111 are formed in the insulating layer 110. A titanium layer 112 and a titanium oxynitride layer 113 are deposited in this order on the insulating layer 110 and on the inner surface of the contact holes 111.

Then, a tungsten layer is deposited onto the titanium oxynitride layer 113 so as to cover its whole surface. The formed tungsten layer is etched back, and tungsten plugs 114b are left in the contact holes 111. FIG. 4 shows a condition that a partial layer of the tungsten layer 114a remains on the regions except the contact holes 111.

A plug-loss 115 may appear while the tungsten layer is being etched back. The plug-loss 115 is a region where the tops of the tungsten plugs 114b are lower than the top surface of the tungsten layer 114a. A trench 116 may appear which exposes the surface of the titanium oxynitride layer 113. A seam 117 may appear at the center of the contact hole 111.

Those plug-losses 115, trenches 116 or the seams 117 may be caused by oxygen discharged from the titanium oxynitride layer 113. The oxygen may accelerate the tungsten layer etching. The plug-losses 115, trenches 116 and seams 117 may raise the contact resistance. The following embodiment describes solution for preventing such problems from occurring.

A method of manufacturing a wiring structure according to an embodiment of the present invention will now be described with reference to FIGS. 1A–1C, 2A, 2B, 3A and 3B. The embodiment exemplifies a case of connection between source/drain regions of a metal-oxide-semiconductor field effect transistor (MOSFET) and an upper wiring layer.

Figure 1A:
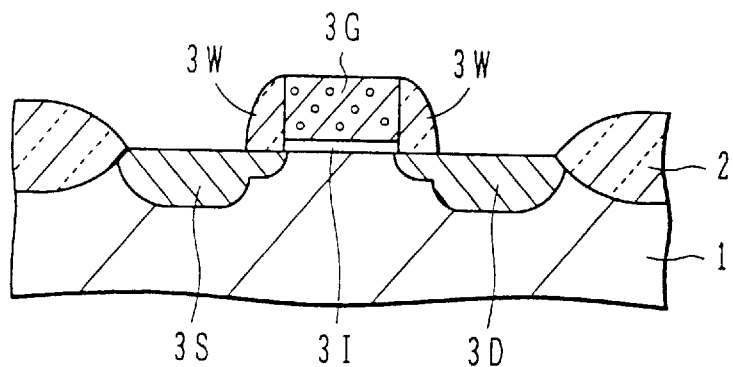
FIGS. 1A–1C, 2A, 2B, 3A and 3B are sectional views of a semiconductor substrate for explaining a forming method of wiring according to the embodiment of the present invention.

As shown in FIG. 1A, a field oxide film 2 is formed on a silicon substrate 1 so as to define active regions on the substrate. On each of the active regions, a MOSFET is formed. The MOSFET has a source region 3S, a drain region 3D, a gate insulator layer 3I and a gate electrode 3G. Side-wall insulators 3W are formed on both side walls of the gate electrode 3G. The side-wall insulators 3W are masks during ion implantation for forming high density regions having the LDD (low density drain) structure.

Figure 1B:
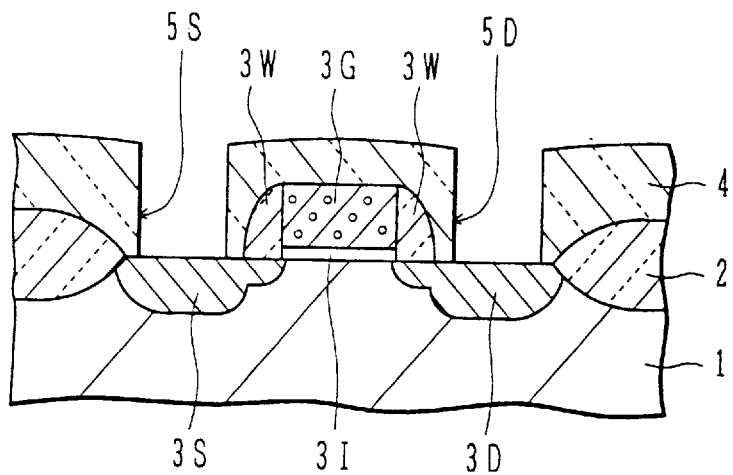

FIG. 1B shows the next step. As shown, an insulating layer 4 is deposited on the whole substrate so that the MOSFETs are covered therewith. The insulating layer 4 is formed by the chemical vapor deposition (CVD). The insulating layer 4 comprises layers of phosphosilicate glass (PSG) and borophosphosilicate glass (BPSG), and has a thickness of approximately 0.8 micrometers. Pairs of contact holes 5S and 5D are formed in the insulating layer so that parts of the source regions 3S and the drain regions 3D are exposed by the contact holes 5S and 5D respectively. Each of the contact holes has a diameter of 0.45 micrometers.

Figure 1C:
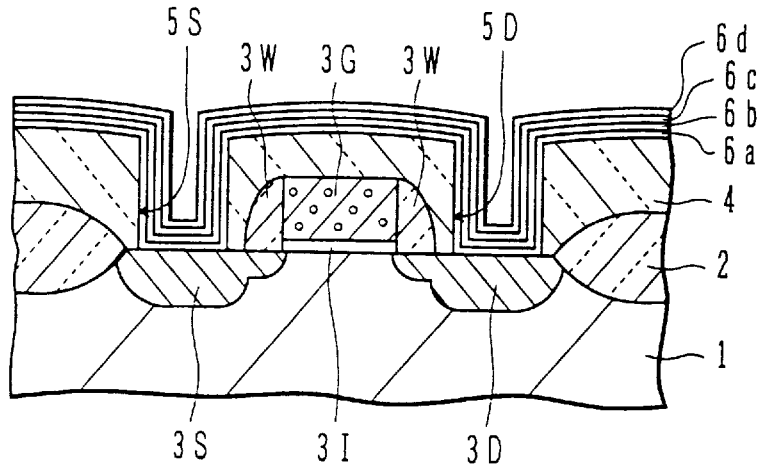

Then, as shown in FIG. 1C, a titanium layer 6a having a thickness of approximately 20 nm is deposited onto the insulating layer 4 and inside surfaces of the contact holes 5S and 5D. A first titanium nitride layer 6b of approximately 25 nm thick is deposited onto the titanium layer 6a. A titanium oxynitride layer 6c of approximately 50–75 nm thick is deposited onto the first titanium nitride layer 6b. A second titanium nitride layer 6d of approximately 25 nm thick is deposited onto the titanium oxynitride layer 6c.

The titanium layer 6a is deposited by the sputtering. Conditions for the sputtering are as follows: a sputtering gas of argon, a substrate temperature of 150° C., an atmospheric pressure of 4 mTorr, the sputter gas flow rate of 15 sccm, and film forming rate of approximately 100 nm/min. The first titanium nitride layer 6b is deposited by reactive sputtering. Conditions for the reactive sputtering are as follows: a titanium target, a mixed gas of nitrogen and argon as a sputtering gas, a substrate temperature of 150° C., an atmospheric pressure of 4 mTorr, the argon gas flow rate of 40 sccm, the nitrogen gas flow rate of 85 sccm, and film forming rate of approximately 75 nm/min. The titanium oxynitride layer 6c is deposited by reactive sputtering after the first titanium nitride layer 6b is deposited by the reactive sputtering. For the reactive sputtering for depositing the titanium oxynitride layer 6c, the flow rate of the argon gas is reduced to 30 sccm, and oxygen gas is introduced into the argon-nitrogen mixture gas with flow rate of 10 sccm. The same titanium target is used continuously. Conditions for the deposition of the second titanium nitride layer 6d are the same as that for the first titanium nitride layer 6b. The second titanium nitride layer 6d is deposited after the oxygen gas introduction is stopped.

The layers 6a to 6d may be deposited successively in the same chamber. However, separated deposition is preferable for preventing the target material from being oxidized or nitrided. That is, the titanium target for depositing the titanium layer 6a is prevented from being oxidized or nitrided by separately, performing the depositions of the titanium layer 6a and the other layers 6b to 6d in different chambers. It is also preferred that the substrate is transferred from the chamber for the deposition of the titanium layer 6a to the chamber for the other layer's deposition under vacuumed atmosphere or non-oxidized atmosphere so as not to be exposed to the atmosphere. Thus, the titanium layer 6a is prevented from being oxidized.

Figure 2A:
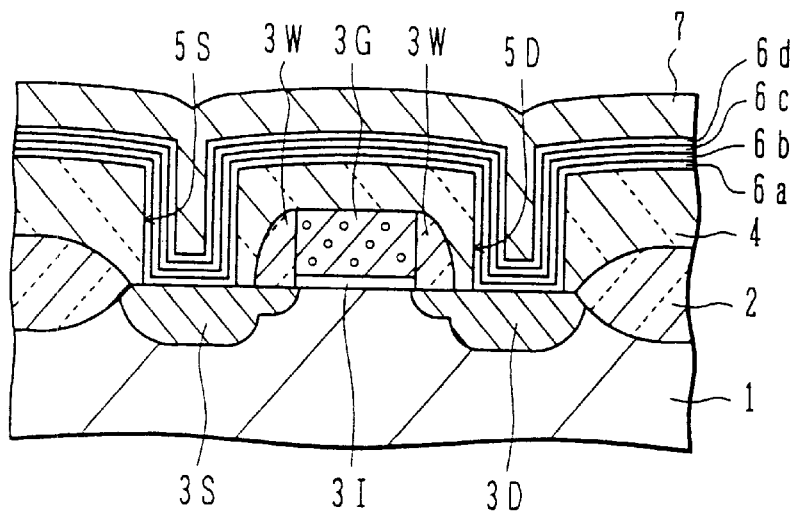

A tungsten layer 7 is deposited by the CVD, as shown in FIG. 2A, after forming a growth core (seed) on the second titanium nitride layer 6d. The deposited tungsten layer 7 has a thickness of, for example, 550 nm which is enough for filling the contact holes 5S and 5D. To form the growth core, SiH$_4$ and WF$_6$ are supplied to the substrate surface for about 35 seconds. For example, conditions for the growth core formation are as follows: an SiH$_4$ flow rate of 4 sccm, a WF$_6$ flow rate of 7–20 sccm, a substrate temperature of 430° C., and a pressure of 4 Torr. Conditions, for example, for the deposition of the tungsten layer 7 are as follows: a source gas of WF$_6$ at a flow rate of 80 sccm, a reduction gas of H$_2$ at a flow rate of 720 sccm, a growth temperature of 450° C., a pressure of 50–80 Torr, a film forming rate of 0.3–0.5 micrometers/min. Thus, the contact holes 5S and 5D are filled with the tungsten layer 7.

Figure 2B:
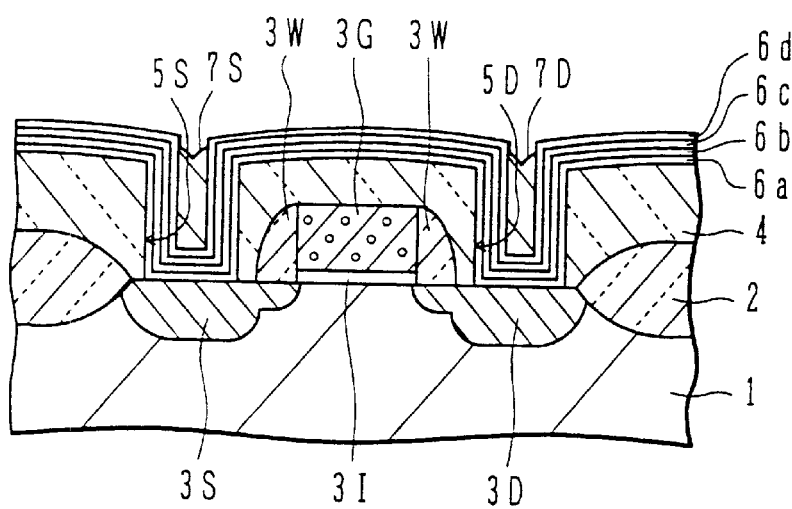

Then, the tungsten layer 7 is etched back so as to be removed except inside the contact holes 5S and 5D, as shown in FIG. 2B. For example, a plasma etching apparatus using electron cyclotron resonance (ECR) etches back the tungsten layer 7 with an etching gas of SF$_6$. The tungsten layer 7 is subjected to the etching for about 140 seconds. Conditions for the etching are as follows: a SF$_6$ gas flow rate of 140 sccm, a pressure of 270 Pa, 200 W of applied power for RF bias and a substrate temperature of 30° C. Thus, tungsten plugs 7S and 7D remain in the contact holes 5S and 5D respectively. And the second titanium nitride layer 6d is exposed except the insides of the contact holes 5S and 5D.

To avoid remaining unnecessary tungsten layer 7 on regions except insides the contact holes 5S and 5D, it is preferred that the tungsten layer is over etched. By over etching, the tops of the tungsten plugs 7S and 7D become lower than the top surface of the second titanium nitride layer 6d. As a result, shallow gaps are formed at a region where the contact holes 5S and 5D are located.

Figure 3A:
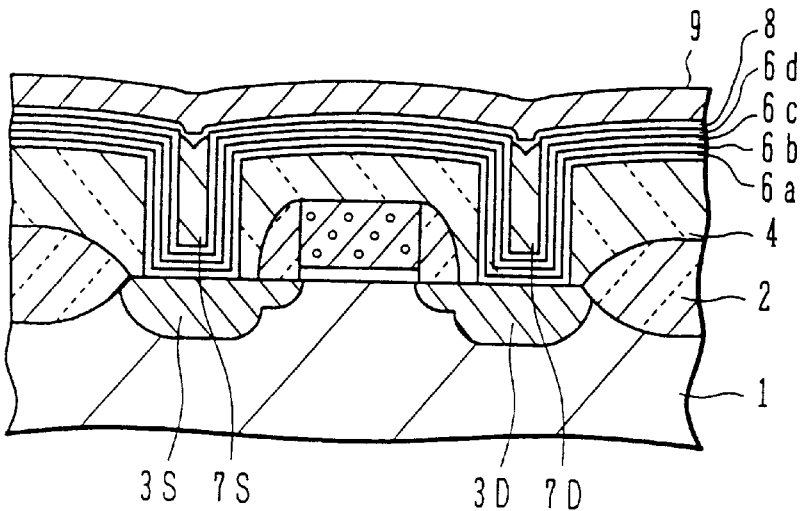

Then, a titanium underlying layer 8 having a thickness of approximately 15 nm is deposited over the whole surface of the substrate including the tops of the tungsten plugs 7S and 7D, as shown in FIG. 3A. The titanium underlying layer 8 is deposited, for example, in the same manner for the deposition of the titanium layer 6a shown in FIG. 1C.

Further, a wiring layer 9 is deposited onto the underlying layer 8 by sputtering. The wiring layer 9 has a thickness of approximately 400 nm, and is composed of aluminum alloy including 1 weight % of silicon and 0.5 weight % of copper. For example, conditions for depositing the wiring layer 9 are as follows: an aluminum alloy target, a sputtering gas of argon, a substrate temperature of 150° C., a pressure of 2 mTorr, a sputtering gas flow rate of 20 sccm and a film forming rate of approximately 1 micrometers/min.

Heat treatment is carried out for about 120 seconds at approximately 450–500° C. after the deposition of the wiring layer 9. The substrate is avoided being exposed to the atmosphere. The heat treatment induces reflow of the aluminum alloy. This causes good coverage recesses at openings of the contact holes 5S and 5D.

Figure 3B:
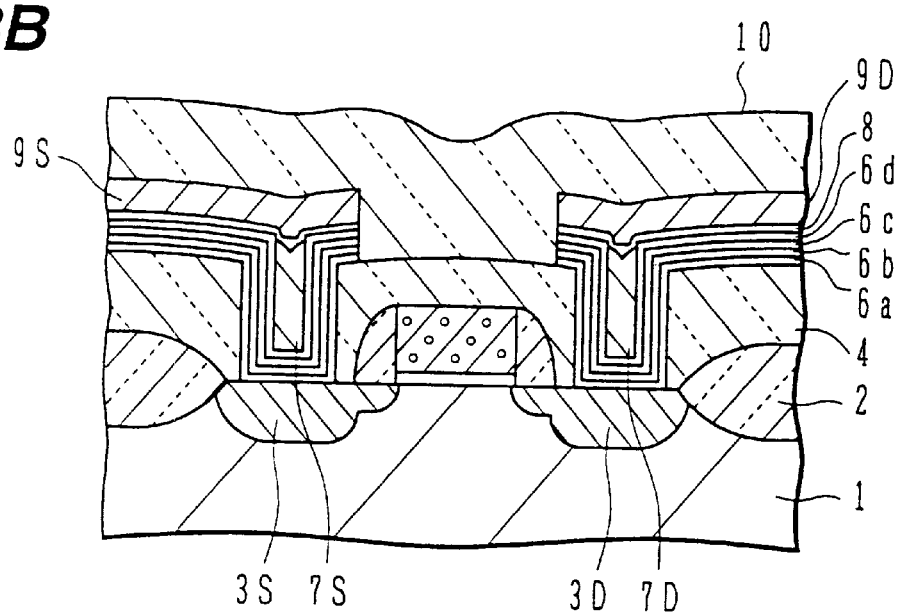

The wiring layer 9 is subjected to patterning so that a wiring 9S connected to the source region 3S through the tungsten plug 7S and a wiring 9D connected to the drain region 3D through the tungsten plug 7D are formed as shown in FIG. 3B. Then, insulation material such as the PSG is deposited over the whole substrate surface to form an insulating layer 10. The insulating layer 10 is deposited by the CVD or the like, and the formed insulating layer 10 covers the wiring 9S and 9D.

According to the above described embodiment, the titanium oxynitride layer 6c is not exposed, because the surface of the substrate is covered with the second titanium nitride layer 6d before depositing the tungsten layer 7 at the step shown in FIG. 2A. Moreover, the titanium oxynitride layer 6c is not exposed while etching back the tungsten layer 7 shown in FIG. 2B, because the second titanium nitride layer 6d prevents the titanium oxynitride layer 6c from being etched. Thus, oxygen is prevented from being discharged from the titanium oxynitride layer 6c. As a result, partial increase of the etching rate of the tungsten layer 7, which is caused by the oxygen, does not occur. Moreover, the pluglosses 115, the trenches 116 and the seams 117 shown in FIG. 4 are also prevented from occurring, and the whole substrate surface is etched smoothly.

According to the above described embodiment, there are four layers of the titanium layer 6a, the first titanium nitride layer 6b, the titanium oxynitride layer 6c and the second titanium nitride layer 6d between the tungsten plugs 7S and the source regions 3S and between the tungsten plugs 7D and the drain regions 3D. The titanium oxynitride layer 6c works as a barrier metal layer which prevents reactions between the tungsten plugs and the silicon substrate from occurring.

In the above described embodiment, the depositions are carried out so that the first titanium nitride layer 6b is sandwiched between the titanium layer 6a and the titanium oxynitride layer 6c. That is, the titanium oxynitride layer 6c does not contact the titanium layer 6a directly. This avoids the titanium layer 6a being exposed to the oxidized atmosphere which is used for the deposition of the titanium oxynitride layer 6c. That is, the titanium layer 6a is not oxidized. As a result, a stable and good electronic contact can be obtained because unnecessary titanium oxide layer caused by oxidizing the titanium layer 6a is prevented from being formed.

In the case where defusant regions on a silicon substrate are connected to a wiring layer under conditions the same as that for the aforementioned evaluation experiment except the thickness of the titanium layer 6a, the first titanium nitride layer 6b, the titanium oxynitride layer 6c and the second titanium nitride layer 6d, good electric contact is also obtained. The thickness of the layers in this case are 20 nm, 25 nm, 50 nm and 25 nm respectively. As a result, the contact resistance between n-type regions and the wiring layer is 18 ohms and that between p-type regions and the wiring-layer is 110 ohms. The ohmic contact characteristics appear in both contacts. Accordingly, covering the titanium layer with the first titanium nitride layer before the titanium oxynitride layer deposition, and covering the titanium oxynitride layer with the second titanium nitride layer before the tungsten layer deposition bring a good electric contact.

In the above embodiment, moreover, the titanium oxynitride layer is deposited by the reactive sputtering. According to this method, it is easy to deposit the layer which is thicker than that formed by oxidizing a titanium nitride layer.

In the above described embodiment, the material of the buried plugs is tungsten. However, a good electric contact may be obtained even if the other conductive material such as Mo or WSi$_x$ is used for the buried plugs.

The embodiment exemplifies the case where the defusant regions on the substrate are connected to their upper wiring layer. However, the connection target of the upper wiring layer is not limited to the defusant regions. The upper wiring layer may be connected to the other semiconductor regions such as polysilicon gate electrodes or polysilicon wiring.

The present invention has been explained referring to the embodiments. However, the present invention is not limited to the embodiments, and various modifications, improvements, combinations, etc. are possible, as should be apparent to those skilled in the art.

What is claimed is:

1. A semiconductor device comprising:

a substrate on which conductive regions of semiconductor material are formed partially;

an insulating layer formed on the substrate, in which contact holes are formed so that their bottom openings are applied to the conductive regions;

a titanium layer formed along inner surfaces of the contact holes;

a first titanium nitride layer formed on the titanium layer in the contact holes;

a titanium oxynitride layer formedon the first titanium nitride layer in the contact holes;

a second titanium nitride layer formed on the titanium oxynitride layer in the contact holes;

buried plugs of a first conductive material formed on the second titanium nitride layer in the contact holes; and a wiring formed on the insulating layer, and electrically connected to the buried plugs, the wiring being made of a second conductive material different than the first conductive material.

2. A semiconductor device according to claim 1, wherein said wiring has a laminated structure, and a bottom layer in said laminated structure is made of titanium.

3. A semiconductor device according to claim 1, wherein said first conductive material is tungsten.

4. A semiconductor device according to claim 1, wherein said second conductive material is aluminum alloy.

* * * * *